(12) United States Patent
Shim

(10) Patent No.: US 7,390,366 B2
(45) Date of Patent: Jun. 24, 2008

(54) APPARATUS FOR CHEMICAL VAPOR DEPOSITION

(75) Inventor: Kyung-Sik Shim, Sungnam (KR)

(73) Assignee: Jusung Engineering Co., Ltd. (KR)

( * ) Notice: Subject to any disclaimer, the term of this patent is extended or adjusted under 35 U.S.C. 154(b) by 351 days.

(21) Appl. No.: 10/282,304

(22) Filed: Oct. 28, 2002

(65) Prior Publication Data

US 2003/0084849 A1       May 8, 2003

(30) Foreign Application Priority Data

Nov. 5, 2001    (KR) ...................... 10-2001-0068511
Nov. 23, 2001  (KR) ...................... 10-2001-0073336

(51) Int. Cl.
| | |
|---|---|
| C23C 16/44 | (2006.01) |
| C23C 16/455 | (2006.01) |
| C23C 16/46 | (2006.01) |
| C23F 1/00 | (2006.01) |
| H01L 21/306 | (2006.01) |

(52) U.S. Cl. ...................... 118/715; 118/725; 118/722; 156/345.33; 156/345.52

(58) Field of Classification Search ................. 118/715; 156/345.55
See application file for complete search history.

(56) References Cited

U.S. PATENT DOCUMENTS

| | | | | |
|---|---|---|---|---|
| 4,545,327 A | * | 10/1985 | Campbell et al. | ........... 118/719 |
| 5,338,363 A | * | 8/1994 | Kawata et al. | .............. 118/725 |
| 5,592,581 A | * | 1/1997 | Okase | ......................... 392/418 |
| 5,928,426 A | * | 7/1999 | Aitchison | .................... 118/715 |
| 5,972,116 A | * | 10/1999 | Takagi | ......................... 118/719 |
| 5,997,651 A | * | 12/1999 | Matsuse et al. | ............. 118/725 |
| 6,223,684 B1 | * | 5/2001 | Fujioka et al. | .......... 118/723 R |

FOREIGN PATENT DOCUMENTS

JP          05-175130         7/1993

OTHER PUBLICATIONS

English translation of Abstract for Japanese patent application No. 05-175130 dated Jul. 13, 1993.
Untranslated Korean Office Action dated Sep. 26, 2003 corresponding to Korean application No. 10-2001-0068511.

* cited by examiner

*Primary Examiner*—Rudy Zervigon
(74) *Attorney, Agent, or Firm*—Ostrolenk, Faber, Gerb & Soffen, LLP

(57) ABSTRACT

An apparatus for CVD is disclosed. Processing gas is injected to an upper center portion of a wafer supporting member by a gas focus ring installed at an inner side surface of a reaction chamber. The processing gas is prevented from coming down to a lower space of the reaction chamber by purge gas supplied from a lower surface of the reaction chamber. Accordingly to this, a particle source is minimized and a period to check an equipment is prolonged. Also, the purge gas is prevented from mounting to an upper space of the reaction chamber by a pressure of the processing gas, thereby not influencing to a process for CVD. The processing gas and the purge gas are exhausted through a gas outlet installed at a lateral wall of the reaction chamber as a ring shaped recess. A shielding layer for preventing the processing gas and the purge gas from being mixed each other is horizontally installed at a middle portion of the gas outlet.

11 Claims, 2 Drawing Sheets

APPARATUS FOR CHEMICAL VAPOR DEPOSITION

BACKGROUND OF THE INVENTION

1. Field of the Invention

The present invention relates to an apparatus for chemical vapor deposition (CVD), and more particularly, to an apparatus for CVD which can prevent a thin layer unexpectedly deposited in a lower space of a reaction chamber from working as a particle source.

2. Description of the Background Art

In an apparatus for CVD in accordance with the conventional art, a gas outlet is generally installed at a lower surface of a reaction chamber. Accordingly, when gas which does not contribute to a thin layer deposition is exhausted outwardly through the gas outlet, the gas is deposited at the lower space of the reaction chamber, so that the lower space works as a particle generating source.

SUMMARY OF THE INVENTION

Therefore, an object of the present invention is to provide an apparatus for CVD which can prolong a period to check an equipment by removing a particle source by preventing gas which does not contribute to a thin layer deposition from going down to a lower space of a reaction chamber.

To achieve these and other advantages and in accordance with the purpose of the present invention, as embodied and broadly described herein, there is provided an apparatus for CVD comprising a reaction chamber for performing a chemical vapor deposition; a wafer supporting member installed in the reaction chamber for mounting a wafer; a gas focus ring installed at an inner surface of the reaction chamber for injecting processing gas from a peripheral portion of the wafer supporting member to an upper center portion of the wafer supporting member; a purge gas supplying hole installed at a lower surface of the reaction chamber for supplying purge gas to an inner portion of the reaction chamber; a ring-shaped gas outlet parallel to a lateral wall of the reaction chamber and located below the gas focus ring for exhausting processing gas injected through the gas focus ring and purge gas supplied through the purge gas supplying hole; one pumping line for connecting the gas outlet and a vacuum pump each other; a shielding layer parallel to the gas outlet and located at a middle portion of the gas outlet for preventing the processing gas and the purge gas exhausted through the gas outlet from being mixed at an entrance of the gas outlet; a plurality of lower division layers with a larger inner diameter than the shielding layer for horizontally dividing the gas outlet below the shielding layer into a plurality of spaces; and a plurality of upper division layers with a larger inner diameter than the shielding layer for horizontally dividing the gas outlet above the shielding layer into a plurality of spaces.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, preferred embodiments of the present invention will be explained with reference to attached drawings.

Figure 1A:
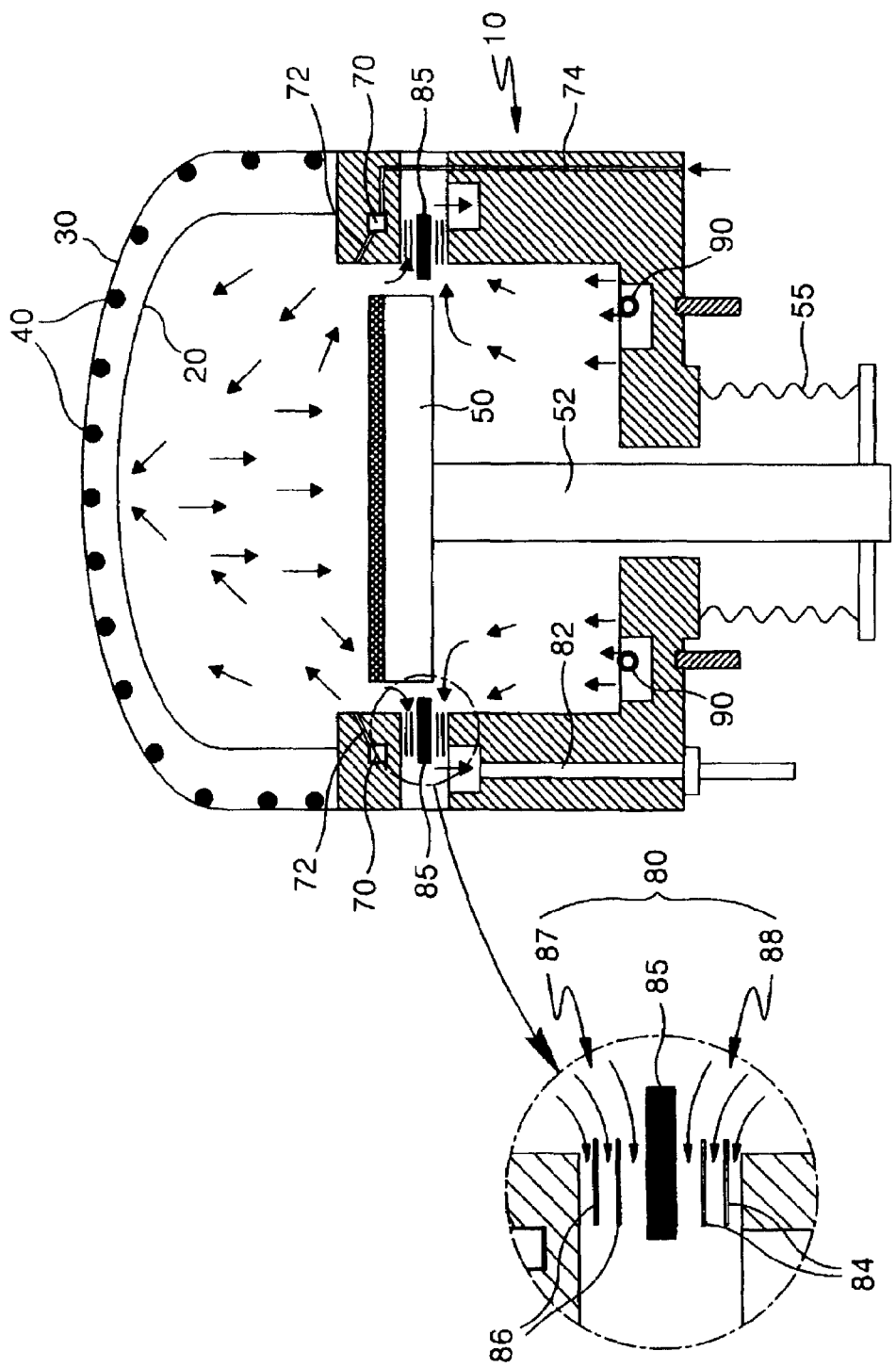
FIGS. 1A and 1B are schematic views to explain an apparatus for CVD according to the present invention.
Figure 1B:
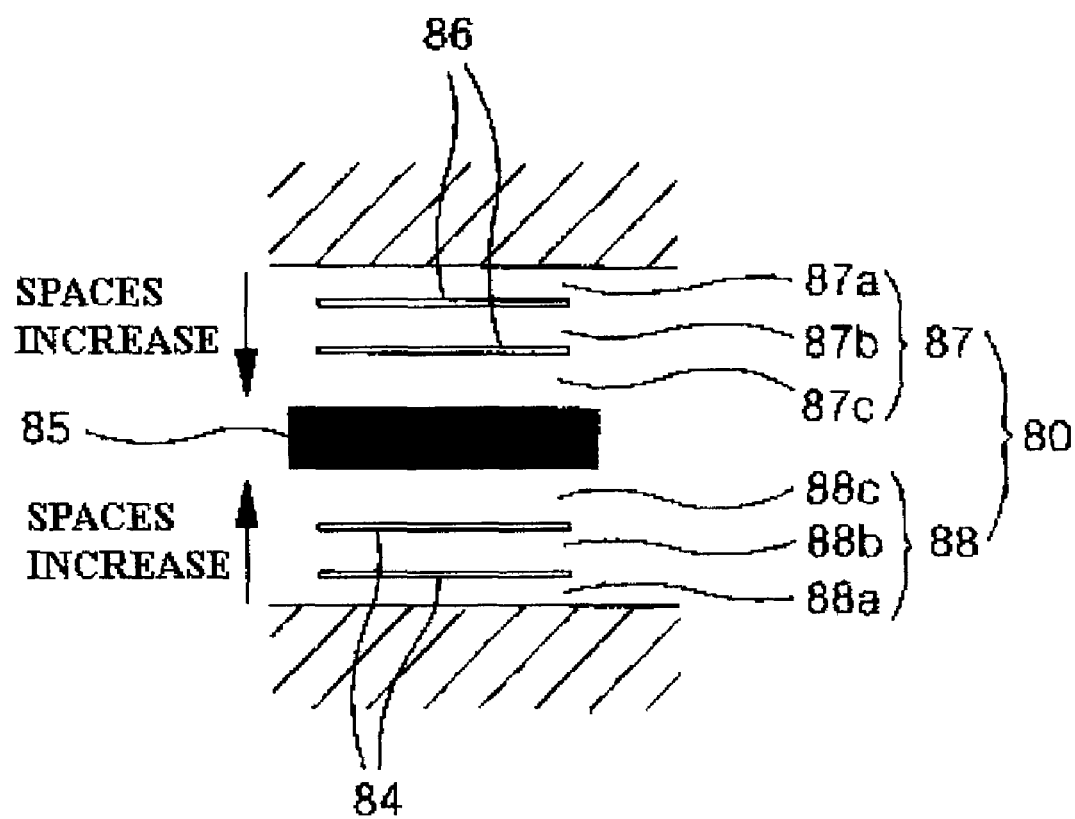

FIGS. 1A and 1B are schematic views to explain an apparatus for CVD according to the present invention.

Referring to FIGS. 1A and 1B, the reaction chamber 10 is a single type chamber in which wafers are inserted one by one, and an upper portion thereof is formed as a quartz dome 20. A bell jar 30 for covering the quartz dome 20 is installed at an outer portion of the quartz dome 20. The bell jar 30 is provided with a bell jar heater 40 at an inner portion thereof. A wafer supporting member 50 is installed at an inner portion of the reaction chamber 10, and a wafer 60 is located on the wafer supporting member 50. The wafer supporting member 50 is provided with a main heater (not shown) for heating the wafer 60 with a proper temperature in which a chemical vapor deposition is performed. The wafer supporting member 50 is supported by a supporting axis. The supporting axis 52 is surrounded by bellows 55, so that a hermetic state is maintained between outside and inside of the reaction chamber 10 even if the supporting axis is transported up and down by the bellows 55.

A gas focus ring 70 is installed at an inner side portion of the reaction chamber 10 so as to surround a lateral portion of the wafer supporting member 50. The gas focus ring 70 is provided with a plurality of injection holes 72. Injection rings can replace the ejection holes 72.

A purge gas supplying hole 90 for supplying purge gas such as $N_2$ or Ar into the reaction chamber 10 is installed at a lower surface of the reaction chamber 10.

A gas outlet 80 for exhausting processing gas injected through the gas focus ring 70 and purge gas supplied through the purge gas supplying hole 90 is installed at a lateral surface of the reaction chamber 10. The gas outlet 80 is located below the gas focus ring 70 and has a recess formed as a ring shape along an inner surface of the reaction chamber. The gas outlet 80 is preferably installed at the same height as the wafer supporting member 50. The gas outlet 80 is connected to one vacuum pump (not shown) by a pumping line 82.

A shielding layer 85 for preventing the processing gas and the purge gas from being mixed each other at the gas outlet 80 is horizontally installed at a middle portion of the gas outlet 80. Accordingly, the gas outlet 80 is divided into a lower gas outlet 88 and an upper gas outlet 87. The purge gas injected through the purge gas supplying hole 90 is exhausted through the lower gas outlet 88, and the processing gas injected through the gas focus ring is exhausted through the upper gas outlet 87.

The gas outlet 80 is divided into upper and lower spaces by the shielding layer 85, which is not completely divided, but the upper and lower spaces are put together at an end portion of the shielding layer 85. The processing gas and the purge gas introduced to the gas outlet 80 is exhausted outwardly through the pumping line 82.

The lower gas outlet 88 is divided into three spaces 88a, 88b, and 88c by a horizontal division of two lower division layers 84. The lower division layer 84 has a large inner diameter than the shielding layer 85. The spaces 88a, 88b, and 88c have higher heights towards an upper direction. If the lower gas outlet 88 is not divided, the purge gas is introduced at the space at one time, thereby generating turbulence. However, if the lower gas outlet 88 is divided into 88a, 88b, and 88c, the purge gas is sequentially exhausted from a lower space little by little, thereby not causing the turbulence. The upper gas outlet 87 is divided into three spaces 87a, 87b, and 87c by a horizontal division of two upper division layers 86. The spaces 87a, 87b, and 87c has higher heights towards a lower direction. The upper division layer 87 has a large inner diameter than the shielding layer 85.

If the processing gas is injected to the gas focus ring 70 through the gas supplying line 74, the processing gas is injected from a peripheral portion of the wafer supporting member 50 to an upper center portion of the wafer supporting member 50 through the injection holes 72. The processing gas injected to the upper center portion of the wafer supporting member 50 collides to the quartz dome 20 being heated by the bell jar heater 40 and is decomposed thermally, thereby uniformly being distributed to an upper space of the wafer supporting member 50. Accordingly, even if the wafer 60 has a large diameter, a uniform chemical vapor deposition takes place at a whole surface of the wafer 60.

Residual processing gas which does not contribute to the CVD is exhausted outwardly through the gas outlet 80. At this time, the purge gas is supplied with a proper flow rate through the purge gas supplying hole 90. The purge gas should be also prevented from mounting to an upper portion of the reaction chamber 10 by a pressure of the processing gas.

The processing gas does not come down to a lower space of the wafer supporting member 50 by a supply of the purge gas, so that a thin film is prevented from being deposited at an inner wall of a lower portion of the reaction chamber 10 such as the wafer supporting member 50 and the supporting axis 52. The purge gas is also prevented from mounting to an upper space of the wafer supporting member 50, thereby not influencing to the CVD. According to this, a uniformity and a deposition speed of a thin film are not influenced by the purge gas. The said effects are more remarkably shown by installing the shielding layer 85.

As aforementioned, according to the apparatus of CVD of the present invention, the processing gas is prevented from coming down to a lower space of the reaction chamber 10 by a pressure of the purge gas, thereby preventing the processing gas from being deposited to a lower space of the reaction chamber 10. Accordingly, not only a particle source is minimized, but also a period to check an equipment can be prolonged. Also, the purge gas is also prevented from mounting to an upper space of the reaction chamber 10 by a pressure of the processing gas, so that the CVD process is hardly influenced by the purge gas.

Also, turbulence by a mixture between the processing gas and the purge gas is prevented by installing the shielding layer 85 and thereby having two entrances in the gas outlet. If the turbulence is generated at the gas outlet 80, in case of that gas is stagnant, heat from the main heater installed at the wafer supporting member 50 causes a burning phenomenon. Also, the processing gas and the purge gas is respectively exhausted from spaces formed by the upper division layers 86 and the lower division layers 84 little by little, thereby more decreasing the turbulence. An amount of exhaustion becomes more toward the shielding layer 80.

As described above and as shown in the foregoing figures, an end of the shielding layer (85) extends in the direction of the wafer supporting member (50). Thus, the distance between the shielding layer (85) and the wafer supporting member (50) becomes narrow. The shielding layer (85) prevents processing gas from flowing in the lower part in the reaction chamber and purge gas from flowing the upper part in the reaction chamber. If processing gas flows to the lower part in the reaction chamber, it might be deposited on the lower part in the reaction chamber and function as an unnecessary particle source. Purge gas flowing to the upper part in the chamber may disturb formation of a film on a wafer by the reaction gas.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An apparatus for chemical vapor deposition (CVD) comprising:
    a reaction chamber;
    a wafer supporting member for mounting a wafer in the reaction chamber;
    a reaction gas supplying unit with at least one gas outlet oriented to supply processing gas to the reaction chamber so that the processing gas impinges on a wafer from above the wafer;
    a purge gas supplying unit for supplying purge gas to the reaction chamber;
    a ring-shaped gas outlet positioned in the vicinity of the wafer supporting member, and extending peripherally around the wafer supporting member; and
    a shielding layer positioned at an entrance of the gas outlet and extending peripherally around the wafer supporting member, said shielding layer separating the gas outlet into an upper part for reaction gas flow and a lower part for purge gas flow so that the processing gas and the purge gas may not be mixed during exhaustion of the gases,
    wherein a distal end of the shielding layer extends toward the wafer supporting member, so that the distal end of the shielding layer is closer to the wafer supporting member than the gas outlet.

2. The apparatus for CVD of claim 1, wherein the reaction chamber is formed as a quartz dome at an upper portion thereof, and a bell jar heater for covering the quartz dome is installed at an outer portion of the quartz dome.

3. The apparatus for CVD of claim 1, wherein the reaction chamber provided with one wafer supporting member is a single type chamber in which wafers are inserted one by one.

4. The apparatus for CVD of claim 1, wherein the gas outlet is installed at the same height as the wafer supporting member.

5. The apparatus for CVD of claim 1, wherein the gas outlet extends parallel along a lateral wall of the reaction chamber and located below an outlet of the reaction gas supplying unit.

6. The apparatus for CVD of claim 1, further comprising at least one division layer for horizontally dividing space in the upper part and the lower part of the gas outlet.

7. The apparatus for CVD of claim 6, wherein the division layer is ring-shaped with a larger inner diameter than that of the shielding layer.

8. The apparatus for CVD of claim 1, further comprising a plurality of division layers for horizontally dividing space in the upper part and the lower part of the gas outlet, wherein a plurality of spaces are formed by the division layers and the distances between the spaces get longer toward the shielding layer.

9. The apparatus for CVD of claim 1, wherein the gas outlet is connected through a pumping line to a vacuum pump.

10. The apparatus for CVD of claim 1, wherein the at least one outlet for supplying processing gas is formed in an inner wall of the reaction chamber.

11. The apparatus for CVD of claim 1, wherein the purge gas supplying unit has at least one outlet at the bottom of the reaction chamber for supplying purge gas to the lower part of the reaction chamber.

* * * * *